United States Patent
Yu et al.

(10) Patent No.: US 7,859,440 B2
(45) Date of Patent: *Dec. 28, 2010

(54) INCREASED RESOLUTION ANALOG TO DIGITAL CONVERTER

(75) Inventors: Huili Yu, Mission Viejo, CA (US); Kunlun Zhu, Irvine, CA (US); Xiaohua Xie, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/317,203

(22) Filed: Dec. 19, 2008

(65) Prior Publication Data

US 2009/0109074 A1     Apr. 30, 2009

Related U.S. Application Data

(63) Continuation of application No. 11/726,125, filed on Mar. 20, 2007, now Pat. No. 7,486,213.

(51) Int. Cl.
*H03M 1/20* (2006.01)
(52) U.S. Cl. .................. 341/131; 341/143; 341/155
(58) Field of Classification Search .......... 341/155, 341/143, 117–120, 131; 398/202
See application file for complete search history.

(56) References Cited

U.S. PATENT DOCUMENTS

| 6,064,328 | A  | * | 5/2000 | Scheidig et al. | 341/155 |
| 6,697,003 | B1 | * | 2/2004 | Chen | 341/143 |
| 7,233,746 | B2 | * | 6/2007 | Blake et al. | 398/202 |
| 7,486,213 | B2 | * | 2/2009 | Yu et al. | 341/131 |
| 2005/0127820 | A1 | * | 6/2005 | Yamazaki et al. | 313/501 |

* cited by examiner

*Primary Examiner*—Jean B Jeanglaude
(74) *Attorney, Agent, or Firm*—Farjami & Farjami LLP

(57) ABSTRACT

According to one embodiment, a method for increasing resolution and accuracy of an analog to digital converter receiving an input voltage includes dithering a number of digital output values from the analog to digital converter to generate a number of dithered values. The analog to digital converter can be an 8-bit analog to digital converter, for example. The dithered values are then averaged to generate an average dithered value. For example, the dithered values can be averaged using a moving average technique. The average dithered value is then scaled down to generate a scaled value. Thereafter, the scaled value is mapped to a, for example, 10-bit digital output having higher resolution and higher accuracy than the raw 8-bit output of the analog to digital converter. In this example, the resolution of the analog to digital converter is increased by a factor of four.

20 Claims, 3 Drawing Sheets

INCREASED RESOLUTION ANALOG TO DIGITAL CONVERTER

This is a continuation of application Ser. No. 11/726,125, filed on Mar. 20, 2007 now U.S. Pat. No. 7,486,213.

BACKGROUND OF THE INVENTION

1. Field of the Invention

The present invention is generally in the field of electronics. More particularly, the present invention is in the field of analog to digital converters and devices using same.

2. Background

Portable electronic devices, such as cellular telephones, typically determine the power remaining in their power source, such as a battery, by measuring the output current or voltage of the power source. For example, the output voltage of the power source can be divided down using a voltage divider and the divided output voltage can be provided to the input of an analog to digital converter to generate a digital output value corresponding to the output voltage of the power source. The digital output value can be used by the electronic device to estimate the power or energy remaining in the power source. Thus, the accuracy of the digital output value generated by the analog to digital converter is critical for accurate estimation of the power remaining in the power source.

However, the output voltage from the power source can vary significantly during the operation of the electronic device or even during times when the electronic device is idle. For example, large fluctuations in the output current of the power source, high radio frequency ("RF") noise, and various digital noise in the electronic device can cause the divided voltage sampled by the analog to digital converter to undesirably fluctuate. Thus, the analog to digital converter can generate inaccurate digital output values, which can undesirably result in inaccurate approximations of the power remaining in the power source.

SUMMARY OF THE INVENTION

A method and system for increasing resolution and accuracy of an analog to digital converter, substantially as shown in and/or described in connection with at least one of the figures, as set forth more completely in the claims.

DETAILED DESCRIPTION OF THE INVENTION

The present invention is directed to a method and system for increasing resolution and accuracy of an analog to digital converter. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
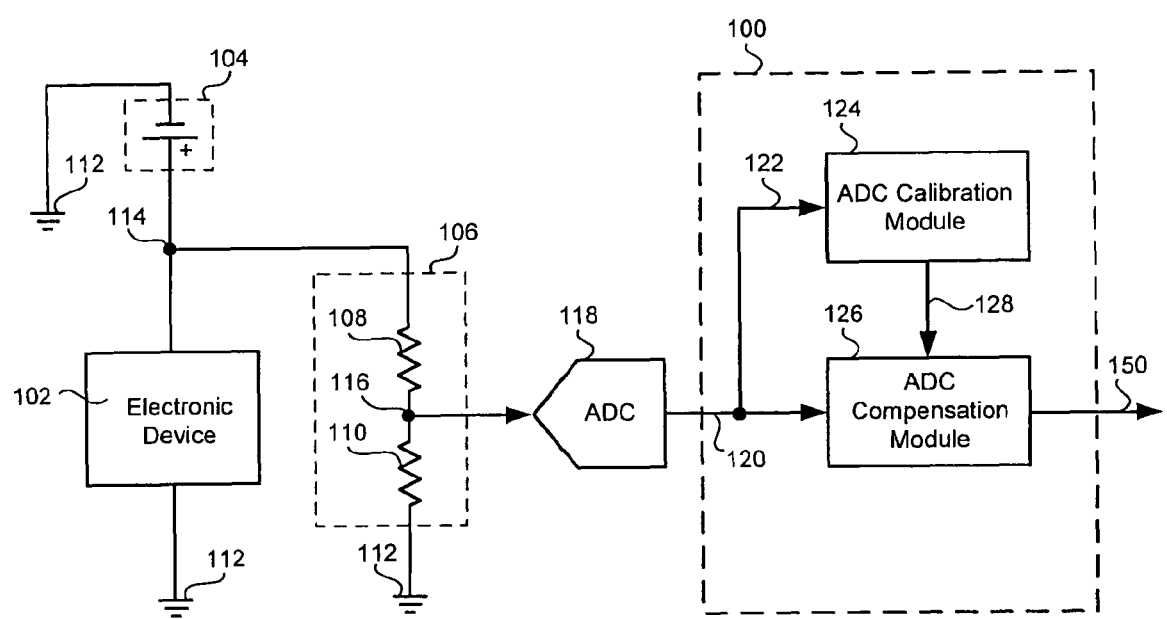
FIG. 1 shows a block diagram of a conventional system using an analog to digital converter.

FIG. 1 shows a block diagram of a conventional system using an analog to digital converter ("ADC"). System 100 includes analog to digital converter calibration module 124 ("ADC calibration module 124") and analog to digital converter compensation module 126 ("ADC compensation module 126"). FIG. 1 further includes electronic device 102, power source 104, voltage divider 106, and analog to digital converter 118 ("ADC 118").

As shown in FIG. 1, electronic device 102 is coupled to the positive terminal of power source 104 at node 114. Electronic device 102 can be, for example, a portable electronic device, such as a cellular telephone, a camera, a personal digital assistant, a lap top computer, a portable DVD or MP3 player or any other electronic device. Power source 104 can be a battery, for example. As also shown in FIG. 1, electronic device 102 and the negative terminal of power source 104 are coupled to ground 112.

As further shown in FIG. 1, the output voltage of power source 104 is divided down using voltage divider 106 and provided to the input of ADC 118 at node 116. Voltage divider 106 in FIG. 1 includes resistors 108 and 110, which are used to divide the output voltage of power source 104 down to a suitable level for ADC 118. For example, if power source 104 has a maximum output voltage of approximately 4.2V and the maximum input voltage for ADC 118 is approximately 1.2V, then the resistances of resistors 108 and 110 can be chosen so as to reduce the maximum output voltage of power source 104 to a level at or below 1.2V at node 116.

ADC 118 can be, for example, an 8-bit analog to digital converter that is configured to sample the divided output voltage at node 116 to produce a digital output value. To improve the accuracy of the digital output value generated by ADC 118, the digital output value can be provided to ADC compensation module 126 via bus 120, which can modify the digital output value to compensate for the DC offset and gain error of ADC 118. The DC offset and gain error of ADC 118 can be determined by disabling power source 104 and by applying a known voltage at node 114. ADC 118 can then sample the divided known voltage at node 116 and can provide a digital output value corresponding to the known voltage to ADC calibration module 124 via bus 122. ADC calibration module 124 can then use the digital output value to determine the DC offset and gain error of ADC 118 and can provide, via bus 128, the DC offset and gain error to ADC compensation module 126, resulting in a relatively low resolution digital output 150 of ADC compensation module 126.

By way of background, the output voltage of power source 104 can vary significantly during the operation of electronic device 102 or even during times when electronic device 102 is idle due, for example, to large fluctuations in the output current of power source 104, high radio frequency ("RF") noise, and/or digital noise. For example, the divided output voltage at node 116 can vary by approximately 20.0 millivolts when electronic device 102 is idle and by approximately 150.0 millivolts when the electronic device is in operation. However, if ADC 118 is an 8-bit analog to digital converter with a full scale input voltage of 1200.0 millivolts, then each step of ADC 118, i.e., the least significant bit of the digital output value of ADC 118, would be approximately 4.7 millivolts. More importantly, if the divided voltage to be sampled by ADC 118 at node 116 is within a small range, such as between 800.0 millivolts and 1100.0 millivolts (corresponding respectively to, for example, 3.5 volts and 4.2 volts of the power source voltage), then only 64 of the 256 available digital output values of ADC 118 would be used. As such, the limited range of ADC 118 coupled with the substantial noise at the input of ADC 118 which can easily exceed the resolution provided by the least significant bit of ADC 118, prevent system 100 from providing adequately accurate digital output values.

Figure 2:
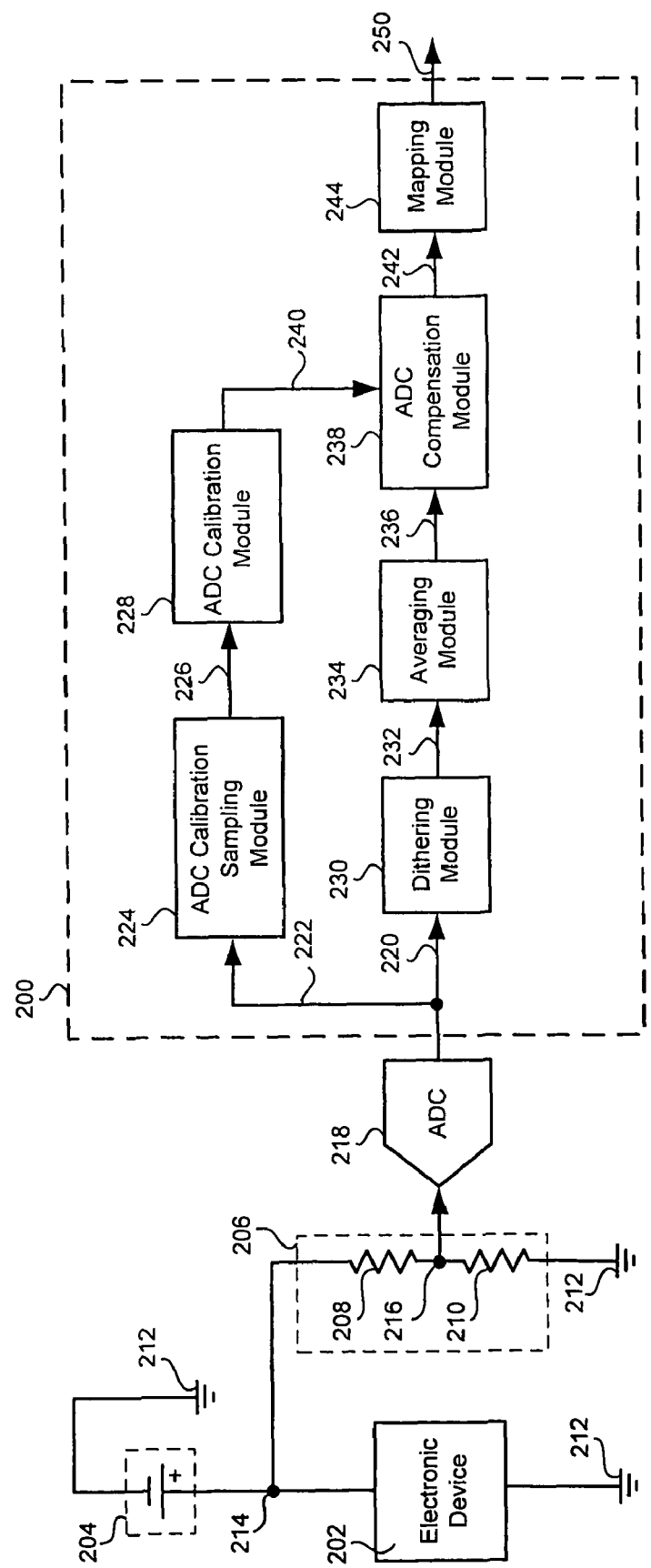
FIG. 2 shows a block diagram of a system for increasing resolution and accuracy of an analog to digital converter in accordance with one embodiment of the present invention.

FIG. 2 shows a block diagram of a system for increasing resolution and accuracy of an analog to digital converter in accordance with one embodiment of the invention. System 200 includes analog to digital converter calibration sampling module 224 ("ADC calibration sampling module 224"), analog to digital converter calibration module 228 ("ADC calibration module 228"), dithering module 230, averaging module 234, analog to digital converter compensation module 238 ("ADC compensation module 238"), and mapping module 244. ADC calibration sampling module 224, ADC calibration module 228, dithering module 230, averaging module 234, ADC compensation module 238, and mapping module 244 can each be implemented in hardware or software or using a combination of hardware and software. FIG. 2 further includes electronic device 202, power source 204, voltage divider 206, and analog to digital converter 218 ("ADC 218").

As shown in FIG. 2, electronic device 202 is coupled to the positive terminal of power source 204 at node 214. Electronic device 202 can be, for example, a portable electronic device, such as a cellular telephone, a camera, a personal digital assistant, a lap top computer, a portable DVD or MP3 player or any other electronic device. Power source 204 can be a battery, for example. As also shown in FIG. 2, electronic device 202 and the negative terminal of power source 204 are coupled to ground 212. As further shown in FIG. 2, the output voltage of power source 204 is divided down using voltage divider 206 and provided to the input of ADC 218 at node 216. Voltage divider 206 in FIG. 2 includes resistors 208 and 210, which are used to divide the output voltage of power source 204 down to a suitable level for ADC 218. For example, if power source 204 has a maximum output voltage of approximately 4.2V and the maximum input voltage for ADC 218 is approximately 1.2V, then the resistances of resistors 208 and 210 can be chosen so as to reduce the maximum output voltage of power source 204 to a level at or below 1.2V at node 216.

ADC 218 can be configured to sample the divided output voltage at node 216 to generate a digital output value corresponding to the divided output voltage. For example, ADC 218 can be an 8-bit analog to digital converter which can sample the divided output voltage to generate an 8-bit digital output value corresponding to the divided output voltage. As shown in FIG. 2, the digital output values generated by ADC 218 can be provided to dithering module 230 via bus 220. Dithering module 230 can be configured to receive a number of digital output values over a period of time and configured to dither the digital output values by summing the digital output values. For example, dithering module 230 can be configured to receive sixteen 8-bit digital output values over a period of approximately 300.0 microseconds and can be further configured to sum the sixteen 8-bit digital output values to generate a 12-bit dithered value.

By summing the digital output values generated by ADC 218, dithering module 230 can advantageously utilize the noise present at node 216 to generate dithered values that ultimately result in significantly higher accuracy and resolution than those available from each individual digital output value generated by ADC 218. Dithering module 230 can be configured to provide each dithered value to averaging module 234 via bus 232. Averaging module 234 can be used to "smooth" out any noise in the dithered values, such as high frequency noise, that may have been captured by ADC 218.

In one embodiment, averaging module 234 can use a moving average technique to average the dithered values. In such an embodiment, averaging module 234 can include a "circular" buffer configured to store 32 dithered values at any given time. The dithered values stored in the circular buffer can be summed and the total divided by the number of dithered values, i.e., 32, to produce an average dithered value. For each new dithered value received by averaging module 234, the "oldest" dithered value in the circular buffer is shifted out in order to accommodate the new dithered value similar to a first-in-first-out technique. The dithered values in the circular buffer are thereafter averaged again in the manner described above.

As shown in FIG. 2, averaging module 234 can be configured to provide the average dithered values to ADC compensation module 238 via bus 236. ADC compensation module 238 can be configured to modify each average dithered value using calibration data produced by ADC calibration module 228 to compensate for the DC offset and gain errors of ADC 218. The DC offset and gain error in ADC 218 can be determined, for example, by disabling power source 204 and by applying a known voltage at node 214. ADC 218 can then receive the divided known voltage at node 216 and can provide a number of digital output values to ADC calibration sampling module 224 via bus 222, which can be configured to generate a sum of the digital output values. For example, if ADC 218 is an 8-bit analog to digital converter, a known voltage approximating the maximum voltage level, e.g., 4.2V, of power source 204 can be applied to node 214. ADC 218 can then provide a number of 8-bit digital output values to ADC calibration sampling module 224 via bus 222. ADC calibration sampling module 224 can be configured to sum a stream of sixteen 8-bit digital output values to generate a 12-bit digital output value corresponding to the maximum voltage level. Thereafter, a known voltage approximating the minimum voltage level, e.g., 3.5V, of power source 204 can be applied to node 214 to determine a 12-bit digital output value corresponding to the minimum voltage level in a similar way discussed above.

ADC calibration module 228 can then use the 12-bit digital output values corresponding to the minimum and maximum voltage levels to determine the DC offset and gain error of ADC 218 using methods known in the art. For example, the DC offset and gain error can be determined by using the 12-bit digital output values corresponding to the minimum and maximum voltage levels to perform a two-point calibration. The DC offset and gain error can then be provided to ADC compensation module 238 via bus 240, which can use the DC offset and gain error data to modify each average dithered value so as to compensate for the DC offset and gain error of ADC 218.

After modifying an average dithered value to compensate for DC offset and gain error, ADC compensation module 238 can be further configured to scale down each average dithered value to generate a scaled value having increased accuracy. For example, ADC compensation module 238 can be configured to divide a 12-bit average dithered value by four to shift out errors in the two least significant bits of the 12-bit average dithered value, thereby generating an accurate 10-bit scaled value.

The scaled value is then provided to mapping module 244 via bus 242. Mapping module 244 can be configured to map the scaled value from ADC compensation module 238 to a 10-bit high resolution digital output 250 corresponding to the digital output values of ADC 218. For example, if ADC 218 is an 8-bit analog to digital converter having a range of 256 possible digital output values, then the 10-bit scaled value can be associated with one of the 256 possible digital output values. For example, for a given range of divided output voltages at node 216, such as 800.0 millivolts to 1100.0 millivolts (corresponding respectively to, for example, 3.5 volts and 4.2 volts of the power source voltage), a 10-bit scaled value indicating a divided output voltage of 800.0 millivolts can be associated with a digital output value of 30, while a 10-bit scaled value indicating a divided output voltage of 1100.0 millivolts can be associated with a digital output value of 230.

As a result, ADC 218 in FIG. 2 can be used to convert a range of divided output voltages using, for example, 200 of the 256 possible digital output values of ADC 218, while providing adequate "headroom" for divided output voltages slightly below 800.0 millivolts or slightly above 1100.0 millivolts. In contrast, due to the low resolution of ADC 118 in FIG. 1, the range of digital output values utilized by ADC 118 to convey a similar range of divided output voltages is substantially less. For example, and as discussed above, ADC 118 utilizes only 64 of the 256 available digital output values of ADC 118 to convert a range of divided output voltages between 800.0 millivolts and 1100.0 millivolts. Thus, for the same range of the power source voltage variations (e.g. variations between 3.5 volts and 4.2 volts), output 250 of mapping module 244 has a much higher resolution digital value (e.g., a 10-bit output with a range of 200 possible values) compared with output 150 of ADC compensation module 126 of FIG. 1 (e.g., an 8-bit output with a range of only 64 possible values).

Figure 3:
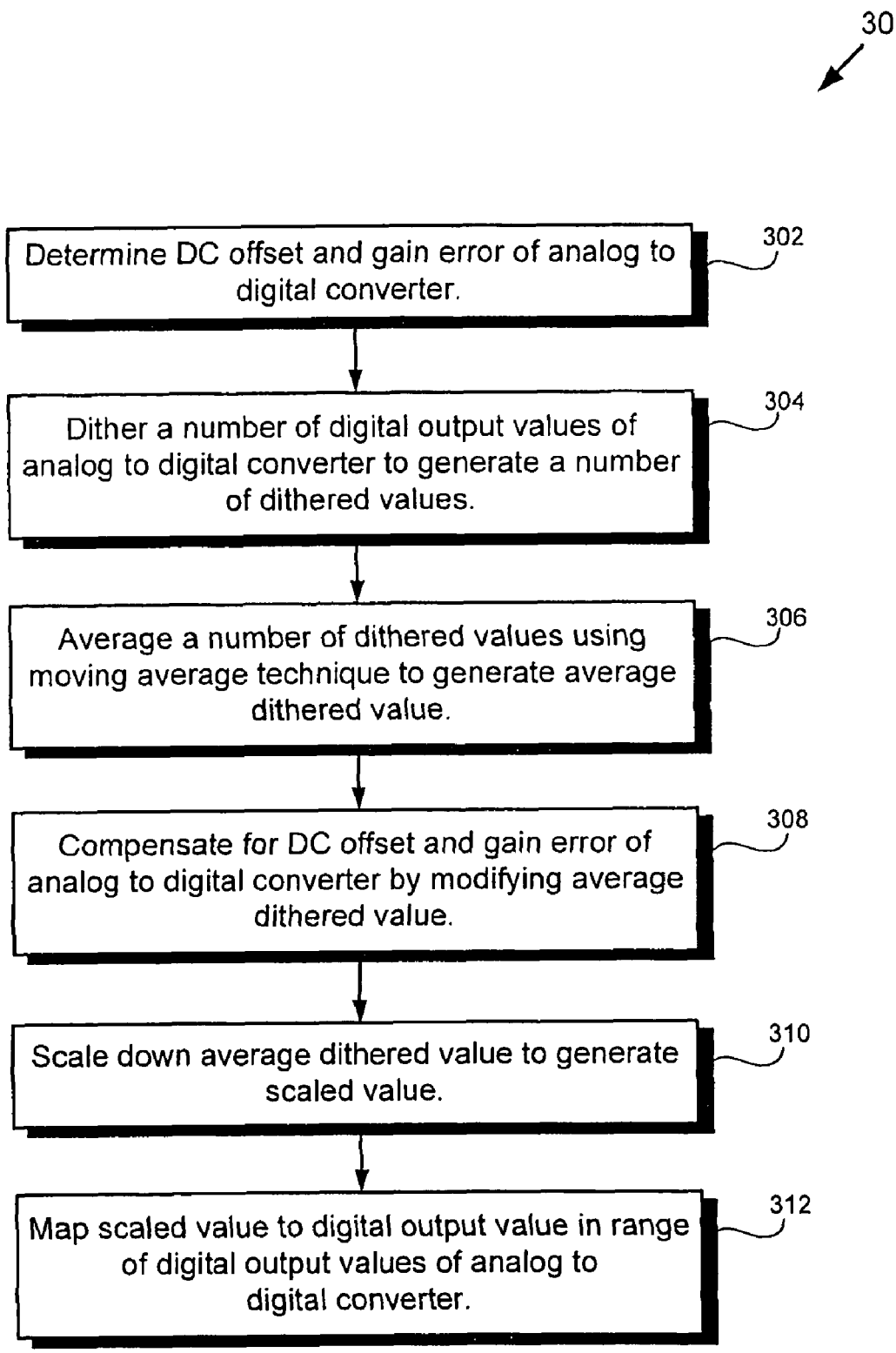
FIG. 3 shows a flowchart of a method for increasing resolution and accuracy of an analog to digital converter in accordance with one embodiment of the present invention.

FIG. 3 illustrates flowchart 300 for performing a method for increasing resolution and accuracy of an analog to digital converter in accordance with one embodiment of the present invention. Each step in flowchart 300, such as step 302, can be performed by any electronic device, such as a cellular telephone having, for example, a processor, memory, and an analog to digital converter. As shown in FIG. 3 and with reference to FIG. 2, at step 302 of flowchart 300, the DC offset and gain error of an analog to digital converter, e.g., ADC 218 in FIG. 2, are determined. At step 304, a number of dithered values are generated by dithering a number of digital output values from the analog to digital converter. For example, each dithered value can be a sum of the digital output values from the analog to digital converter. In one embodiment, each dithered value can be a 12-bit dithered value generated by summing 16 consecutive 8-bit digital output values from the analog to digital converter.

At step 306, a number of the dithered values are averaged using a moving average technique to generate an average dithered value. At step 308, the average dithered value is modified to compensate for the DC offset and gain error of the analog to digital converter. At step 310, the average dithered value is scaled down to generate a scaled value. For example, a 12-bit average dithered value can be scaled down to a 10-bit scaled value by dividing the 12-bit average dithered value by four. At step 312, the scaled value is mapped to a high resolution digital output value corresponding to digital output values of the analog to digital converter.

Thus, the invention uses dithering to increase the resolution of an analog to digital converter and a moving average technique to remove noise from the digital output values, thereby increasing the accuracy of the analog to digital converter. Therefore, as discussed above, the resolution of an analog to digital converter can be increased by a factor of four, e.g., from 8 bits to 10 bits, while effectively increasing the accuracy of the analog to digital converter. In other embodiments, the resolution of an analog to digital converter can be increased by a factor greater than four. Moreover, since the invention can be implemented using software or a combination of hardware and software, the invention can be used to increase the resolution and accuracy of an analog to digital converter with low cost.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method and system for increasing resolution and accuracy of an analog to digital converter have been described.

The invention claimed is:

1. A method for increasing a resolution of an analog to digital converter, said method comprising:
    averaging a plurality of dithered values obtained from said analog to digital converter to generate an average dithered value;
    using said average dithered value to generate a high resolution digital output.

2. The method of claim 1 wherein said using said average dithered value comprises:
    scaling down said average dithered value to generate a scaled value.

3. The method of claim 2 wherein said using said average dithered value further comprises:
    mapping said scaled value to generate said high resolution digital output.

4. The method of claim 1 wherein said plurality of dithered values are determined by summing a plurality of digital output values provided by said analog to digital converter.

5. The method of claim 1 wherein said averaging includes performing a moving average.

6. The method of claim 1 further comprising modifying said average dithered value to compensate for a DC offset of said analog to digital converter.

7. The method of claim 1 further comprising modifying said average dithered value to compensate for a gain error of said analog to digital converter.

8. The method of claim 1 wherein said resolution of said analog to digital converter is increased by a factor of at least four.

9. A system for increasing a resolution of an analog to digital converter, said system comprising:
    an averaging module for averaging a plurality of dithered values obtained from said analog to digital converter to generate an average dithered value;
    said system using said average dithered value to generate a high resolution digital output.

10. The system of claim 9 further comprising:
    an analog to digital converter compensation module for scaling down said average dithered value to generate a scaled value.

11. The system of claim 10 further comprising:
a mapping module for mapping said scaled value to generate said high resolution digital output.

12. The system of claim 10 wherein said analog to digital converter compensation module is configured to modify said average dithered value to compensate for a DC offset of said analog to digital converter.

13. The system of claim 10 wherein said analog to digital converter compensation module is configured to modify said average dithered value to compensate for a gain error of said analog to digital converter.

14. The system of claim 9 wherein a dithering module is configured to sum a plurality of digital output values provided by said analog to digital converter to generate said plurality of dithered values.

15. The system of claim 9 wherein said averaging module is configured to perform a moving average.

16. The system of claim 9 wherein said high resolution digital output indicates an output voltage of a power source of an electronic device.

17. The system of claim 16 wherein said electronic device is selected from the group consisting of a cellular telephone, a camera, a personal digital assistant, a lap top computer, a portable DVD player, and an MP3 player.

18. A system for increasing a resolution of an analog to digital converter, said system comprising:
an analog to digital converter compensation module for scaling down an average dithered value to generate a scaled value;
a mapping module for mapping said scaled value to generate a high resolution digital output.

19. The system of claim 18 further comprising:
an averaging module to generate said average dithered value for use by said compensation module in said analog to digital converter;
said system using said average dithered value to generate a high resolution digital output.

20. The system of claim 18 wherein said analog to digital converter compensation module is configured to modify said average dithered value to compensate for a DC offset of said analog to digital converter.

* * * * *